US010267831B2

(12) United States Patent
Chandra et al.

(10) Patent No.: US 10,267,831 B2
(45) Date of Patent: Apr. 23, 2019

(54) PROCESS VARIATION COMPENSATION WITH CORRELATED ELECTRON SWITCH DEVICES

(71) Applicant: ARM Ltd., Cambridge (GB)

(72) Inventors: Vikas Chandra, Fremont, CA (US); Mudit Bhargava, Austin, TX (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/282,939

(22) Filed: Sep. 30, 2016

(65) Prior Publication Data

US 2018/0096713 A1   Apr. 5, 2018

(51) Int. Cl.

| | |
|---|---|
| *G11C 7/06* | (2006.01) |
| *H03K 5/22* | (2006.01) |
| *G01R 19/165* | (2006.01) |
| *G01R 31/28* | (2006.01) |
| *G11C 13/00* | (2006.01) |
| *G11C 29/02* | (2006.01) |
| *G11C 29/12* | (2006.01) |
| *G11C 29/16* | (2006.01) |

(52) U.S. Cl.
CPC ....... *G01R 19/165* (2013.01); *G01R 31/2851* (2013.01); *G11C 7/065* (2013.01); *G11C 13/0002* (2013.01); *G11C 13/003* (2013.01); *G11C 13/004* (2013.01); *G11C 13/0069* (2013.01); *G11C 29/026* (2013.01); *G11C 29/028* (2013.01); *G11C 29/12005* (2013.01); *G11C 29/16* (2013.01); *G11C 7/062* (2013.01); *G11C 2013/0042* (2013.01); *G11C 2013/0083* (2013.01); *G11C 2029/1204* (2013.01)

(58) Field of Classification Search
CPC ..... G11C 7/06; G01R 19/165; G01R 31/2851
See application file for complete search history.

(56) References Cited

U.S. PATENT DOCUMENTS

| | | | | |
|---|---|---|---|---|
| 5,726,597 | A | * | 3/1998 | Petty .................. H03F 3/45762 |
| | | | | 327/307 |
| 7,298,640 | B2 | | 11/2007 | Chen et al. |
| 7,564,310 | B2 | * | 7/2009 | Yo-Jong ................... H03F 1/52 |
| | | | | 330/282 |
| 7,639,523 | B2 | | 12/2009 | Celinska et al. |
| 7,778,063 | B2 | | 8/2010 | Brubaker et al. |
| 7,872,900 | B2 | | 1/2011 | Paz de Araujo et al. |
| 9,165,246 | B2 | * | 10/2015 | Pickett .................... G11C 11/54 |
| 9,478,308 | B1 | * | 10/2016 | Boujamaa ............ G11C 17/165 |
| 9,558,819 | B1 | | 1/2017 | Aitken et al. |
| 9,584,118 | B1 | | 2/2017 | Dao et al. |
| 9,589,636 | B1 | | 3/2017 | Bhavnagarwala et al. |
| 9,627,615 | B1 | | 4/2017 | Reid et al. |
| 9,742,397 | B2 | * | 8/2017 | Yuan ..................... H03F 1/0205 |
| 9,773,550 | B2 | * | 9/2017 | Bhavnagarwala ........................ |
| | | | | G11C 13/0069 |
| 9,792,982 | B1 | * | 10/2017 | Sandhu ............... G11C 13/004 |

(Continued)

OTHER PUBLICATIONS

EE Times "Intel, Micron Launch "Bulk-Switching" ReRAM", Jul. 28, 2015.*

*Primary Examiner* — Kenneth B Wells
(74) *Attorney, Agent, or Firm* — Berkeley Law & Technology Group, LLP

(57) ABSTRACT

Subject matter disclosed herein may relate to correlated electron switch devices, and may relate more particularly to compensating for integrated circuit manufacturing process variation with correlated electron switch devices.

20 Claims, 10 Drawing Sheets

(56) References Cited

U.S. PATENT DOCUMENTS

| | | | |
|---|---|---|---|
| 9,805,777 B2 * | 10/2017 | Sandhu | G11C 7/222 |
| 9,851,738 B2 * | 12/2017 | Sandhu | G05F 3/08 |
| 2008/0106926 A1 | 5/2008 | Brubaker | |
| 2008/0107801 A1 | 5/2008 | Celinska et al. | |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2017/0033782 A1 | 2/2017 | Shifren et al. | |
| 2017/0045905 A1 | 2/2017 | Sandhu et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |

* cited by examiner

PROCESS VARIATION COMPENSATION WITH CORRELATED ELECTRON SWITCH DEVICES

BACKGROUND

Field

Subject matter disclosed herein may relate to correlated electron switch devices, and may relate more particularly to compensating for integrated circuit manufacturing process variation with correlated electron switch devices.

Information

Integrated circuit devices, such as electronic switching devices, for example, may be found in a wide range of electronic circuit types in a wide range of electronic devices. For example, memory, logic, analog, and/or other electronic circuit types may incorporate electronic switches that may be used in computers, digital cameras, cellular telephones, tablet devices, personal digital assistants, etc. Factors related to electronic switching devices, such as may be incorporated in memory, logic, analog, and/or other electronic circuit types, that may be of interest to a designer in considering suitability for any particular application may include physical size, storage density, operating voltages, impedance ranges and/or power consumption, for example. Other example factors that may be of interest to designers may include, for example, cost of manufacture, ease of manufacture, scalability, and/or reliability. Moreover, there appears to be an ever increasing need for memory, logic, analog, and/or other electronic circuit types that exhibit characteristics of lower power, lower cost, and/or greater performance.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1B:
FIG. 1b depicts an illustration of an example symbol for a correlated electron switch device, in accordance with an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe example embodiments utilizing correlated electron materials (CEMs) in correlated electron switch (CES) devices, for example, such as may be utilized to form a correlated electron random access memory (CERAM) in memory and/or logic devices, and/or such as may be utilized in any number of other circuit and/or device types, for example. Correlated electron materials, which may be utilized in the construction of CERAM devices and CES devices, for example, may also be utilized in a wide range of other electronic circuit types, such as, for example, memory controllers, memory arrays, processors, microcontrollers, filter circuits, data converters, optical instruments, phase locked loop circuits, microwave and millimeter wave transceivers, and so forth, although claimed subject matter is not limited in scope in these respects. In this context, a CES device may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in conductive and resistive RAM devices. In one aspect, a substantially rapid conductor-to-insulator transition in a CES device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a CEM between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of a CES device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of a CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar to the relatively higher impedance state.

Further, in an embodiment, transitioning from a relatively insulative/higher impedance state to a substantially dissimilar and relatively conductive/lower impedance state may bring about a change in capacitance in addition to a change in resistance. For example, a CEM may exhibit a variable resistance together with a property of variable capacitance. In other words, impedance characteristics of a CEM may include both resistive and capacitive components. For example, in a metal state, a CEM may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating a CEM and, therefore, a CEM may exhibit higher capacitance based, at least in part, on additional charges stored within a CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of a CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, one or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM may comprise one or more materials selected from a group comprising aluminum, cadmium, chromium, cobalt, copper, gold, iron, manganese, mercury, molybdenum, nickel, palladium, rhenium, ruthenium, silver, tin, titanium, vanadium, yttrium, and zinc (which may be linked to a cation, such as oxygen or other types of ligands), or combinations thereof, although claimed subject matter is not limited in scope in this respect.

Figure 1A:
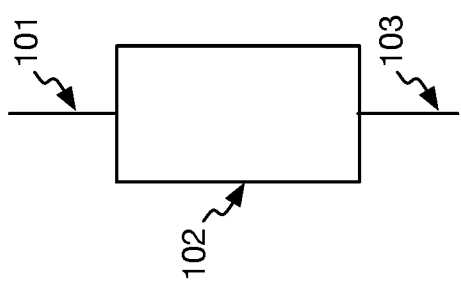
FIG. 1a shows block diagram of an example embodiment of a correlated electron switch device comprising a correlated electron material, in accordance with an embodiment.

FIG. 1a shows an example embodiment 100 of a CES device comprising CEM, such as one or more materials 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, a CEM, such as material 102, may transition between aforementioned relatively conductive/lower impedance states and relatively insulative/higher impedance states. As mentioned, a CEM, such as one or more materials 102, in a variable impeder device, such as CES device 100, may transition between a first impedance state and a second impedance state due to a quantum mechanical transition of the correlated electron switch material as a result of an applied critical voltage and an applied critical current, as described in more detail below. Also, as mentioned above, a variable impeder device, such as variable impeder device 100, may exhibit properties of both variable resistance and variable capacitance.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
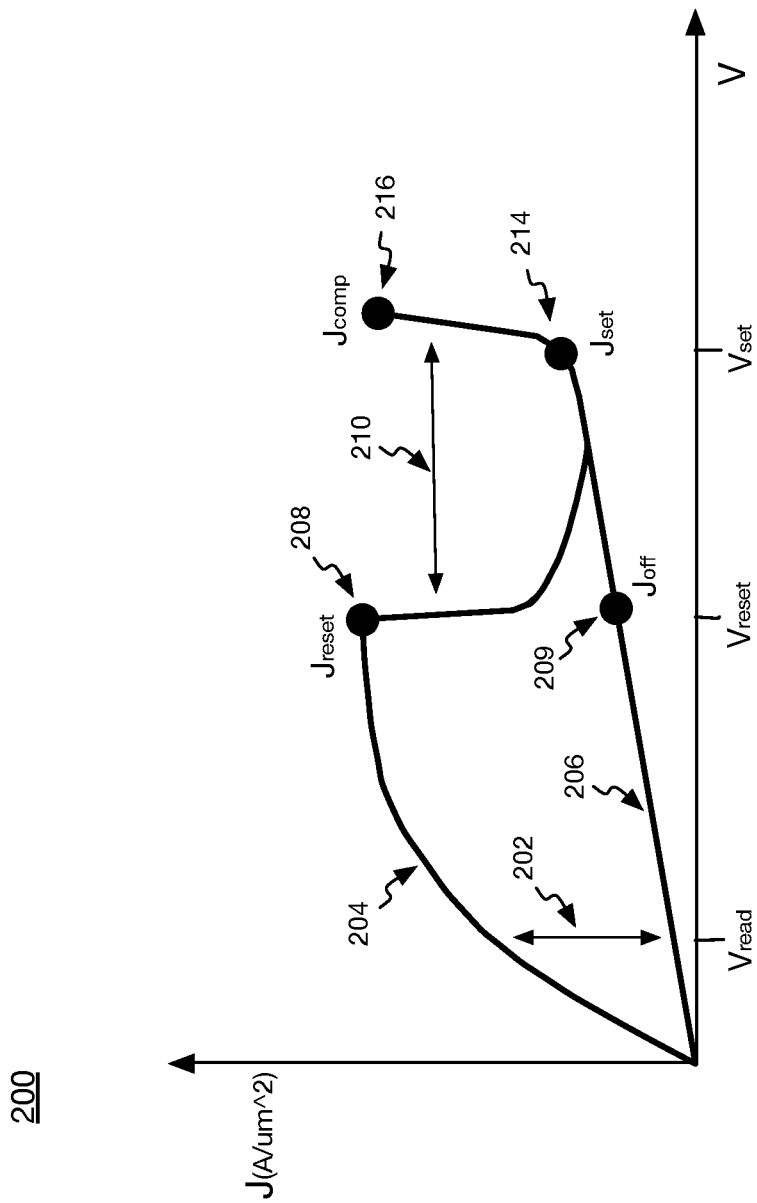
FIG. 2 shows an example plot of current density versus voltage for a correlated electron switch device, in according to an embodiment.

FIG. 2 is a diagram showing an example voltage versus current density profile of a device formed from a CEM according to an embodiment 200. Based, at least in part, on a voltage applied to terminals of a CEM device, for example, during a "write operation," a CEM device may be placed into a relatively low-impedance state or a relatively high-impedance state. For example, application of a voltage $V_{set}$ and a current density $J_{set}$ may place a CEM device into a relatively low-impedance memory state. Conversely, application of a voltage $V_{reset}$ and a current density $J_{reset}$ may place a CEM device into a relatively high-impedance memory state. As shown in FIG. 2, reference designator 210 illustrates the voltage range that may separate $V_{set}$ from $V_{reset}$. Following placement of a CEM device into a high-impedance state or low-impedance state, the particular state of a CEM device may be detected by application of a voltage $V_{read}$ (e.g., during a read operation) and detection of a current or current density at terminals of a CEM device.

According to an embodiment, a CEM device of FIG. 2 may include any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, a CEM device of FIG. 2 may comprise materials of the general form AB:$L_x$ (such as NiO:CO) where AB represents a transition metal, transition metal compound, or transition metal oxide variable impedance material and $L_x$ represents a dopant ligand; though it should be understood that these are exemplary only and are not intended to limit claimed subject matter. Particular implementations may employ other variable impedance materials as well. Nickel oxide, NiO, is disclosed as one particular TMO. NiO materials discussed herein may be doped with extrinsic ligands, $L_x$ which may establish and/or stabilize variable impedance properties. In particular, NiO variable impedance materials disclosed herein may include a carbon-containing ligand such as carbonyl (CO), forming NiO:CO. In another particular example, NiO doped with extrinsic ligands may be expressed as NiO:$L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. In particular, NiO variable impedance materials disclosed herein may include carbon containing molecules of the form $C_aH_bN_dO_f$ (in which a≥1, and b, d and f≥0) such as: carbonyl (CO), cyano (CN⁻), ethylene diamine ($C_2H_8N_2$), phen(1,10-phenanthroline) ($C_{12}H_8N_2$), bipyridine ($C_{10}H_8N_2$), ethylenediamine (($C_2H_4(NH_2)_2$)), pyridine ($C_5H_5N$), acetonitrile ($CH_3CN$), and cyanosulfanides such as thiocyanate (NCS⁻), for example.

In accordance with FIG. 2, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a substantially dissimilar impedance state, such as a relatively high-impedance state, responsive to a Mott transition. This may correspond to point 208 of the voltage versus current density profile of FIG. 2. At, or suitably nearby this point, electrons are no longer screened and become localized. This correlation may result in a strong electron-electron interaction potential which may operate to split the bands to form a relatively high-impedance material. If a CEM device comprises a relatively high-impedance state, current may be generated by transportation of electron holes. Consequently, if a threshold voltage is applied across terminals of a CEM device, electrons may be injected into a metal-insulator-metal (MIM) diode over the potential barrier of the MIM device. If a threshold current of electrons is injected and a threshold potential is applied across terminals to place a CEM device into a "set" state, an increase in electrons may screen electrons and remove a localization of electrons, which may operate to collapse the band-splitting potential, thereby bringing about a relatively low-impedance state.

According to an embodiment, current in a CEM device may be controlled by an externally applied "compliance" condition, which may be determined at least partially on the basis of an applied external current, which may be limited during a write operation, for example, to place a CEM device into a relatively high-impedance state. This externally-applied compliance current may, in some embodiments, also set a condition of a current density for a subsequent reset operation to place a CEM device into a relatively high-impedance state. As shown in the particular implementation of FIG. 2, a current density $J_{comp}$ may be applied during a write operation at point 116 to place a CEM device into a relatively high-impedance state, and may determine a compliance condition for placing a CEM device into a low-impedance state in a subsequent write operation. As shown in FIG. 2, a CEM device may be subsequently placed into a low-impedance state by application of a current density $J_{reset} \geq J_{comp}$ at a voltage $V_{reset}$ at point 208, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance memory state may determine a number of holes to be injected to a CEM device for subsequently transitioning a CEM device to a relatively high-impedance memory state.

As pointed out above, a reset condition may occur in response to a Mott transition at point 208. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \quad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 204 of the voltage versus current density profile shown in FIG. 2, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

In which $A_{CEM}$ is a cross-sectional area of a CEM device; and $J_{reset}(V_{MI})$ may represent a current density through a CEM device to be applied to a CEM device at a threshold voltage $V_{MI}$, which may place a CEM device in a relatively high-impedance state.

Figure 3:
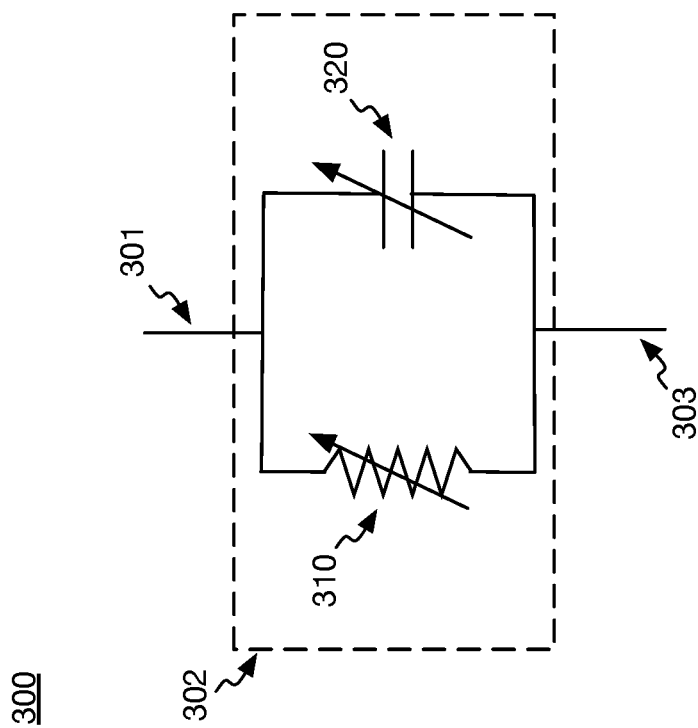
FIG. 3 is a schematic diagram of an equivalent circuit of a correlated electron switch, in accordance with an embodiment.

FIG. 3 depicts a schematic diagram of an equivalent circuit of an example CEM switch device according to an embodiment 300. As previously mentioned, a correlated electron device, such as a CEM switch, a CERAM array, or other type of device utilizing one or more correlated electron materials may comprise a variable or complex impedance device that may exhibit characteristics of both variable resistance and variable capacitance. In other words, impedance characteristics for a CEM variable impedance device, such as the device according to embodiment 300, may depend at least in part on resistance and capacitance characteristics of the device if measured across device terminals 301 and 302, for example. In an embodiment, an equivalent circuit for a variable impedance device may comprise a variable resistor, such as variable resistor 310, in parallel with a variable capacitor, such as variable capacitor 320. Of course, although a variable resistor 310 and variable capacitor 320 are depicted in FIG. 3 as comprising discrete components, a variable impedance device, such as device of embodiment 300, may comprise a substantially homogenous CEM and claimed subject matter is not limited in this respect.

Table 1 below depicts an example truth table for an example variable impedance device, such as the device of embodiment 300.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In an embodiment, Table 1 shows that a resistance of a variable impedance device, such as the device of embodiment 300, may transition between a low-impedance state and a substantially dissimilar high-impedance state as a function at least partially dependent on a voltage applied across a CEM device. In an embodiment, an impedance exhibited at a low-impedance state may be approximately in the range of 10.0-100,000.0 times lower than a substantially dissimilar impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Truth Table 1 shows that a capacitance of a variable impedance device, such as the device of embodiment 300, may transition between a relatively lower capacitance state, which, in an example embodiment, may comprise approximately zero, or very little, capacitance, and a relatively higher capacitance state that is a function, at least in part, of a voltage applied across a CEM device.

According to an embodiment, a CEM device, which may be utilized to form a CEM switch, a CERAM memory device, and/or a variety of other electronic devices comprising one or more correlated electron materials, may be placed into a relatively lower-impedance memory state, such as by transitioning from a relatively higher-impedance state, for example, via injection of a sufficient quantity of electrons to satisfy a Mott transition criteria. In transitioning a CEM device to a relatively lower-impedance state, if enough electrons are injected and the potential across the terminals of a CEM device overcomes a threshold switching potential (e.g., $V_{set}$), injected electrons may begin to screen. As previously mentioned, screening may operate to un-localize double-occupied electrons to collapse the band-splitting potential, thereby bringing about a relatively lower-impedance state.

As mentioned, integrated circuit devices, such as electronic switching devices, for example, may be found in a wide range of electronic circuit types in a wide range of electronic devices. For example, memory, logic, analog, and/or other electronic circuit types may incorporate electronic switches that may be used in computers, digital cameras, cellular telephones, tablet devices, personal digital assistants, etc. Factors related to electronic switching devices, such as may be incorporated in memory, logic, analog, and/or other electronic circuit types, that may be of interest to a designer in considering suitability for any particular application may include physical size, storage density, operating voltages, impedance ranges and/or power consumption, for example. Other example factors that may be of interest to designers may include, for example, cost of manufacture, ease of manufacture, scalability, and/or reliability. Moreover, there appears to be an ever increasing need for memory, logic, analog, and/or other electronic circuit types that exhibit characteristics of lower power, lower cost, and/or greater performance.

In an embodiment, it may be desirable and/or advantageous to compensate for manufacturing process variations in an integrated circuit device. For example, it may be advantageous and/or desirable to compensate for process variation by providing a circuit with programmable impedance characteristics to allow for tuning of a circuit by adjusting one or more voltage and/or current levels for one or more particular nodes in a circuit, in an embodiment. In some circuits, such as sense amplifiers, for example, a circuit with programmable impedance characteristics may be utilized to shift an offset voltage to compensate for process variation, which may result in greater performance and/or lower power consumption, for example. Further, in an embodiment, a plurality of CES devices may be utilized as a register to store electronic signals and/or states that may be programmed in accordance with desired compensation characteristics for a particular circuit, for example.

Figure 4:
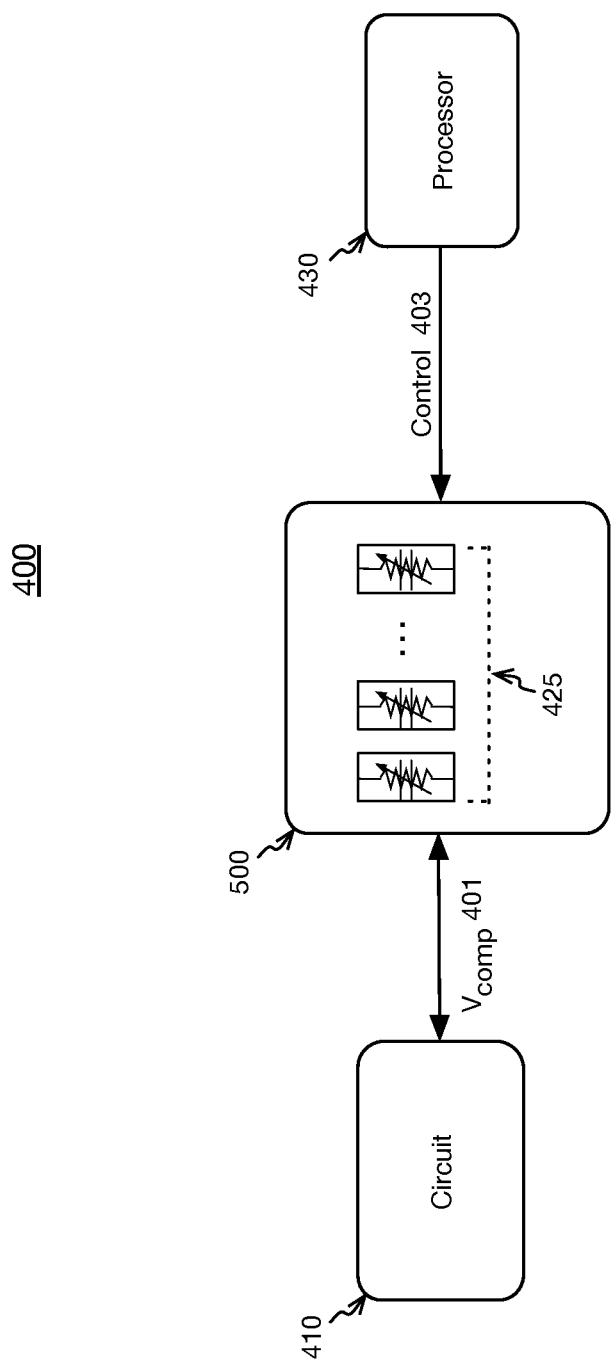
FIG. 4 depicts a schematic block diagram of an example circuit for compensating for integrated circuit manufacturing process variation, in accordance with an embodiment.

FIG. 4 depicts a schematic block diagram of an embodiment 400 of an example circuit for compensating for integrated circuit manufacturing process variation. In an embodiment, a circuit, such as circuit 410, may experience variable behavior depending, at least in part, on manufacturing process variation. For example, if a circuit, such as circuit 410, includes one or more integrated devices, such as one or more transistors and/or one or more resistors, etc., it may be advantageous to adjust one or more characteristics (e.g., voltage, current, capacitance, impedance, etc.) at one or more nodes of the circuit to account for manufacturing process variations. For example, in an embodiment, a voltage signal, such as compensation voltage signal $V_{comp}$ 401, may be adjusted to account for manufacturing process variations exhibited by the one or more transistors and/or one or more resistors, etc., of a circuit, such as circuit 410.

In an embodiment, a programmable impedance circuit, such as programmable impedance circuit 500, may comprise two or more CES devices, such as CES devices 425. In an embodiment, two or more CES devices, such as CES devices 425, may be arranged in a series configuration, as described more fully below. Also, in an embodiment, a plurality of voltage signals, such as control signals 403, may be utilized by a control circuit, such as processor 430, for example, to individually program CES devices, such as individual CES devices 425. For example, individual CES devices may be set or reset based at least in part on states of one or more voltage signals, as described more fully below. For the example depicted in FIG. 4, individual CES devices 425 may be individually programmed based at least in part on states of one or more control signals 403, in an embodiment.

In an embodiment, an integrated circuit, such as 410, may comprise a sense amplifier circuit that may be utilized, for example, in a memory device. However, claimed subject matter is not limited in scope in this respect. Embodiments in accordance with claimed subject matter may find utility in a wide range of electronic circuit types including, for example memory, logic, analog, and/or other electronic circuit types.

Figure 5:
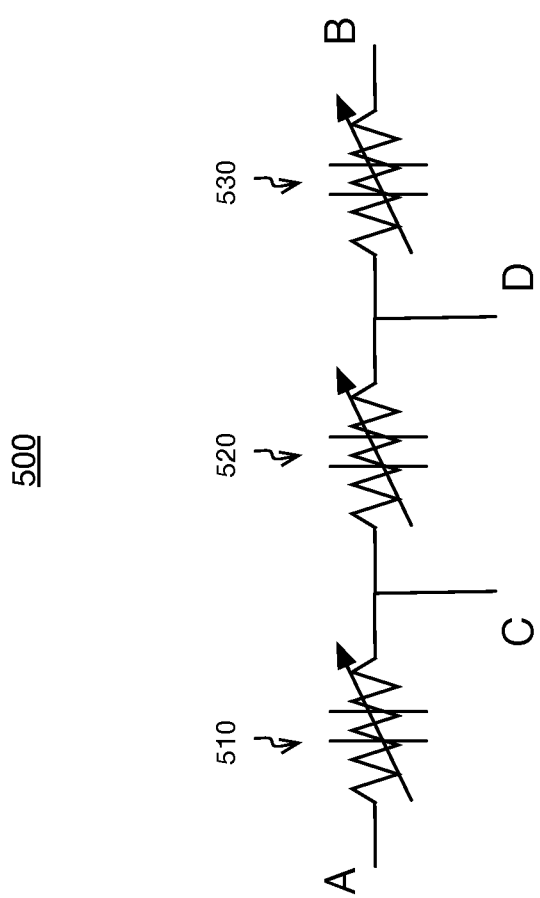
FIG. 5 depicts a schematic block diagram of an example circuit including a plurality of individually programmable example correlated electron switch devices, in accordance with an embodiment.

FIG. 5 depicts a schematic block diagram of an embodiment 500 of an example programmable impedance circuit including a plurality of individually programmable example correlated electron switch devices, such as CES devices 510, 520, and 530. Although the example of FIG. 5 depicts three CES devices, claimed subject matter is not limited in scope in this respect. Embodiments in accordance with claimed subject matter may include at least two CES devices and/or may include greater than three CES devices, for example. For the embodiment depicted in FIG. 5, a programmable impedance circuit, such as circuit 500, may comprise a plurality of CES devices, such as CES devices 510, 520, and/or 530, arranged in a series configuration, as depicted. Further, in an embodiment, a plurality of voltage signals, such as voltage signals A, B, C, and/or D, may be utilized to individually program CES devices, such as CES devices 510, 520, and/or 530. For example, to transition CES device 520 from a relatively lower impedance state to a relatively higher impedance state, a control circuit, such as a processor and/or state machine, for example, may apply a voltage signal with sufficient magnitude across CES device 520 by way of voltage signals C and D to induce a reset condition in CES device 520. Also, for example, to transition CES device 520 from a relatively lower impedance state to a relatively higher impedance state, a control circuit may apply a voltage signal with sufficient magnitude across CES device 530 by way of voltage signals D and B to induce a reset condition in CES device 520.

Further, in an embodiment, multiple CES devices, such as two or more of CES devices 510, 520, and/or 530, may be programmed substantially concurrently. For example, to program CES devices 510 and/or 520 substantially concurrently, appropriate voltage levels may be applied via voltage signals A, C, and/or D to achieve a set or reset condition in the CES devices, depending on whether a relatively lower impedance state and/or a relatively higher impedance state is desired.

In an embodiment, CES devices, such as CES devices 510, 520, and/or 530, may be programmed in such a manner so as to improve the probability that spurious set or reset conditions do not occur. In an embodiment, programming operations may be constrained to keeping a sufficient number of CES devices at a relatively lower impedance state to help prevent spurious reset conditions. For example, if CES devices 510, 520, and 530 are programmed to a relatively lower impedance state, individual CES devices 510, 520, and/or 530 may experience a voltage drop of $V_{dd}/3$, where $V_{dd}$ represents a voltage applied between voltage signals A and B of example embodiment 500. If $V_{dd}$ is approximately 1.0V, for example, the voltage drop at individual CES devices would be approximately 1.0V/3, or 0.33V. In an embodiment, an example reset voltage threshold may be approximately 0.6V, for example. Therefore, for the present example having CES devices 510, 520, and 530 programmed to a relatively lower impedance state, individual CES devices only experience voltage drops of approximately 0.33V, well below the reset threshold of 0.6V, and no reset condition is reached.

Further, in an embodiment, programming operations may be constrained to keeping a sufficient number of CES devices at a relatively higher impedance state to help prevent spurious set conditions. For example, if at least two of CES devices 510, 520, and/or 530 are programmed to a relatively higher impedance state, individual CES devices 510, 520, and/or 530 may experience a voltage drop of no more than Vdd/2. If Vdd is approximately 1.0V, for example, the voltage drop at individual CES devices would be no more than approximately 1.0V/2, or 0.5V. In an embodiment, a set voltage threshold may be approximately 0.9V, for example. Therefore, for the present example having at least two of CES devices 510, 520, and/or 530 programmed to a relatively higher impedance state, individual CES devices only experience voltage drops of at most approximately 0.5V, and no set condition is reached.

Therefore, in an embodiment, to help guard against spurious set and/or reset conditions for CES devices of a programmable impedance circuit, such as example circuit 500, programming constraints may be specified such that either none of the CES devices of the programmable impedance circuit are programmed to a relatively higher impedance state or at least two of the CES devices are programmed to a relatively higher impedance state. Of course, the specific programming combination discussed in connection with the example embodiments herein are merely example combinations, and claimed subject matter is not limited in scope in this respect.

In an embodiment, CES devices, such as CES devices 510, 520, and/or 530, may be manufactured such that the CES devices are initially programmed in a relatively lower impedance state. That is, the CES devices may be "born" in a relatively lower impedance state. To program two or more individual CES devices, such as two or more of CES devices 510, 520, or/or 530, voltage signals greater in magnitude than a reset threshold voltage level ($V_{Reset}$) may be applied across two or more individual CES devices to initiate transitions in the individual CES devices from a relatively lower impedance state to a relatively higher impedance state. For example, to transition CES devices 510 and 530 from a relatively lower impedance state to a relatively higher impedance state, a voltage signal $V_{AC}$ may be applied across CES device 510 and a voltage signal $V_{DB}$ may be applied across CES device 530, wherein $V_{AC} > V_{Reset}$ and wherein $V_{DB} > V_{Reset}$.

Similarly, in an embodiment, to program one or more individual CES devices, such as one or more of CES devices 510, 520, or/or 530, one or more voltage signals greater in magnitude than a set threshold voltage level ($V_{Set}$) may be applied across one or more individual CES devices to initiate transitions in the individual CES devices from a relatively higher impedance state to a relatively lower impedance state E. For example, to transition CES devices 510 and 530 from a relatively higher impedance state to a relatively lower impedance state, a voltage signal $V_{AC}$ may be applied across CES device 510 and a voltage signal $V_{DB}$ may be applied across CES device 530, wherein $V_{AC} > V_{Set}$ and wherein $V_{DB} > V_{Set}$.

Figure 6:
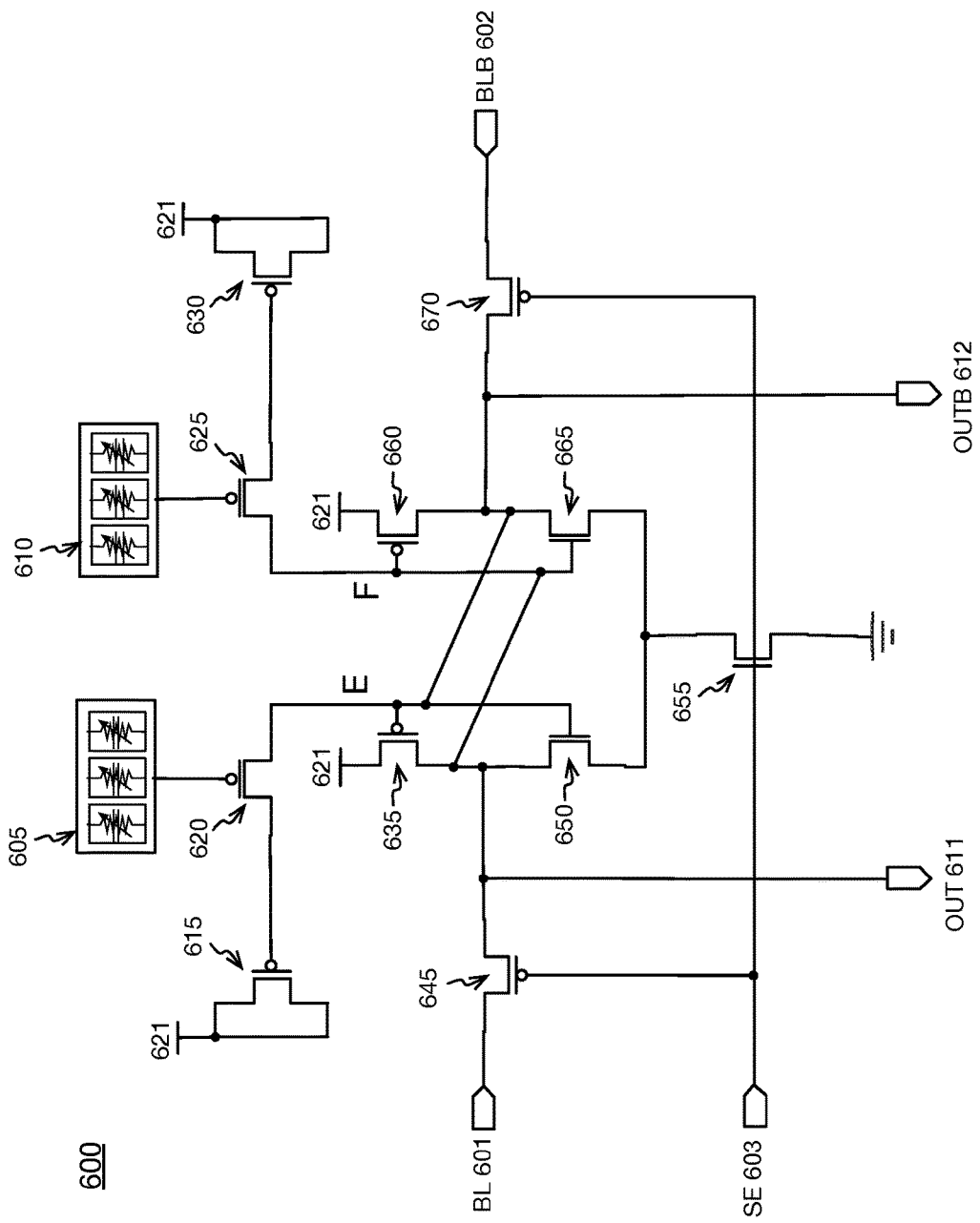
FIG. 6 is a schematic diagram depicting an example sense amplifier including a plurality of correlated electron switch devices, in accordance with an embodiment.

FIG. 6 is a schematic diagram depicting an embodiment 600 of an example sense amplifier circuit including a plurality of CES devices included in programmable impedance circuits 605 and/or 610. In an embodiment, a sense amplifier circuit, such as 600, may be employed in a range of electronic device types, including, for example, memory devices. In an embodiment, a bit line signal (BL), such as BL 601, may be precharged to a voltage level. Also, in an embodiment, an inverse bit line signal (BLB), such as BLB 602, may also be precharged to another voltage level, which may represent an approximate logical inverse of BL 601. Further, at least in part in response to a non-asserted state of a sense enable signal (SE), such as SE 603, PMOS transistors 645 and 670 may become enabled, thereby electrically coupling BL 601 with output signal (OUT) 611 and electrically coupling BLB 602 with OUTB 612. Thus, while SE 603 is not asserted, voltage levels found on BL 601 and BLB may be electronically conducted to OUT 611 and OUTB 612, respectively.

As utilized herein, the term "asserted" and the like in the context of a high-enabled signal (e.g., SE 603, BL 601, etc.) refers to a logically high voltage level (binary "1") and "non-asserted" and the like refers to a logically low voltage level (binary "0"). Similarly, "asserted" and the like in the context of a low-enabled signal refers to a logically low voltage level and "non-asserted" and the like refers to a logically high voltage level. In an embodiment, a logically high voltage level may be determined at least in part by a supply voltage signal, such as 621, In an embodiment, an assertion of SE 603 may enable NMOS transistor 655, and current may begin to flow through one or more of NMOS transistors 650 and/or 665, and/or through one or more of PMOS transistors 635 and/or 660. Depending at least in part on a voltage level on output signal OUTB 612, output OUT 611 may begin to be pulled to a logically high voltage level via transistor 635 or pulled to a logically low voltage level via transistor 650 at least in part in response to assertion of SE 603. Similarly, depending at least in part on a voltage level on output signal OUT 611, output OUTB 612 may begin to be pulled to a logically high voltage level via transistor 660 or pulled to a logically low voltage level via transistor 665 at least in part in response to assertion of SE 603. Because, in an embodiment, OUT 611 and OUTB 612, initially derived at least in part from BL 601 and BLB 602, respectively, may be inverses of each other, one of OUT 611 and OUTB 612 may tend to be pulled to a logically high voltage level, and the other of OUT 611 and OUTB 612 will tend to be pulled to the logically low voltage level. The rates at which the signals are pulled towards either a logically high voltage level or a logically low voltage level may depend, at least in part, on the physical characteristics of transistors 635, 650, 660, and/or 665. Also, due at least in part to possible mismatches of physical characteristics of one or more transistors due at least in part to variations in a manufacturing process, for example, an "offset voltage" threshold level may be met and/or exceeded before pull-up/pull-down structures of transistors 635, 650, 660, and/or 665 can operate as intended. For example, if an offset voltage threshold level is not achieved by the difference in voltage levels found on BL 601 and BLB 602 just prior to assertion of SE 603, sense amplifier circuit 600 may fail to generate valid output signals.

Because senses amplifier circuits, such as 600, are meant to amplify relatively small differences in voltage signals to generate larger differences, it may be advantageous to provide a way to tune the performance of a sense amp to lower voltage offset threshold levels and to therefore help improve performance, reliability, and/or power consumption, for example. In an embodiment, it may be advantageous to adjust the rates at which one or both of output signals 611 and 612 are pulled towards either a logically low voltage level or a logically high voltage level to compensate, at least in part, for differences in physical characteristics of one or more transistors and/or other sense amplifier circuit structures. For example, if it is assumed for the purposes of explanation that transistor 660 due to its physical characteristics conducts current more readily than transistor 650 due to its respective physical characteristics, it may be advantageous to ad some capacitance to node "E" to reduce its rate of voltage change in relation to node "F."

In an embodiment, programmable impedance circuits 605 and/or 610 may act as registers, storing one or more signals and/or states that are indicative of a specified amount of capacitance to be added to node E and/or node F, respectively. For example, PMOS transistors 615 and/or 630 may comprise structures designed and/or manufactured to have specified capacitance characteristics. Electronic switches, such as transistors 620 and/or 625, may determine how much of the capacitance of structures 615 and/or 630 are added to nodes E and F, respectively. Programmable impedance circuits 605 and/or 610 may provide adjustable signal levels to transistors 620 and/or 625, respectively, depending at least in part on the signals and/or states stored in programmable impedance circuits 605 and/or 610, in an embodiment.

Further, in an embodiment, test procedures may be performed on integrated circuit devices as part of a manufacturing process to determine voltage offset levels for one or more circuits, such as one or more sensor circuits. Programmable impedance circuits, such as 605 and/or 610, may be programmed experimentally to determine how to tune circuits, such as sense amps, to help reduce voltage offset threshold values and therefore help improve performance, reliability, and/or power consumption, for example.

Figure 7:
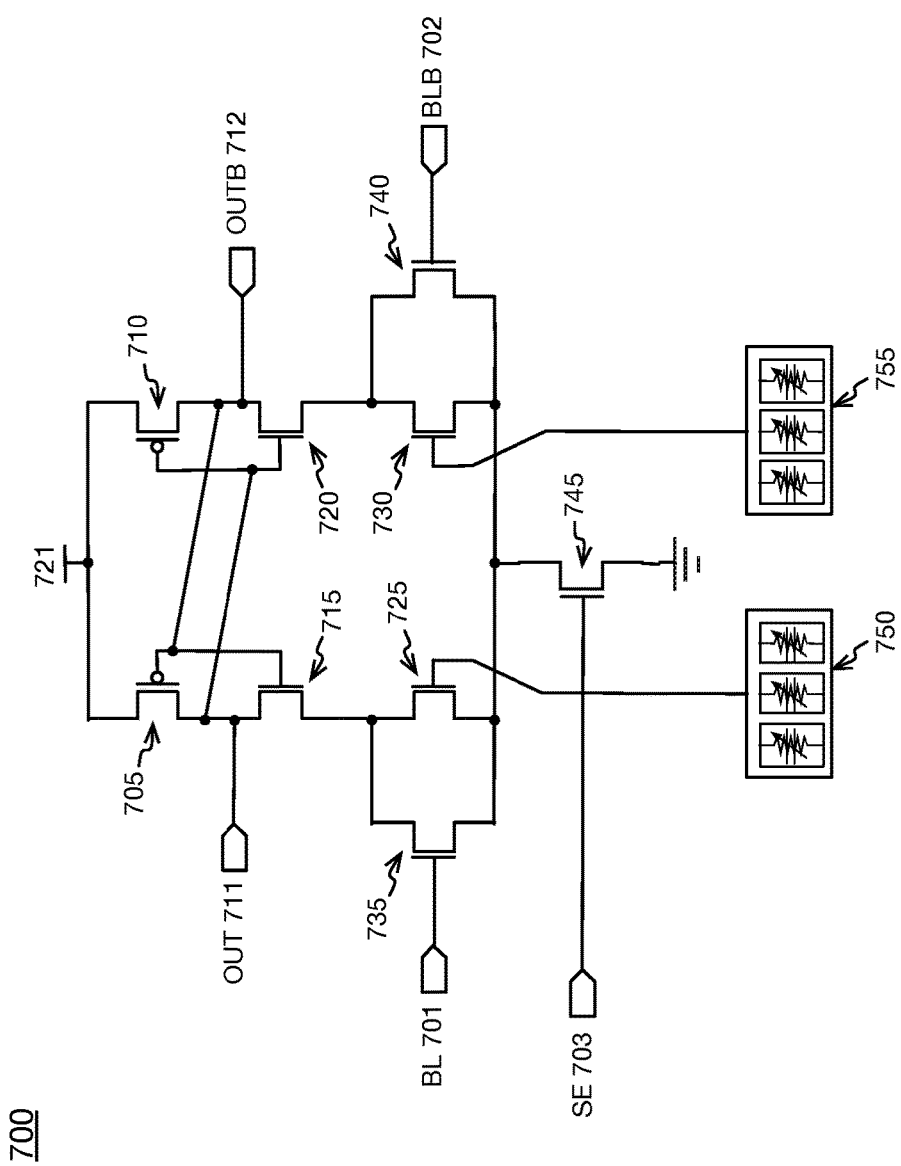
FIG. 7 is a schematic diagram depicting an example sense amplifier including a plurality of correlated electron switch devices, in accordance with an embodiment.

FIG. 7 is a schematic diagram depicting an embodiment 700 of an example sense amplifier circuit including programmable impedance circuits 750 and/or 755, in accordance with an embodiment. In an embodiment, an assertion of a sense enable signal (SE), such as SE 703, may enable a transistor, such as NMOS transistor 745, and current may begin to flow through one or more of NMOS transistors 735 and/or 740, as well as through NMOS transistors 715 and/or 720 and/or one or more of PMOS transistors 705 and/or 710. Depending at least in part on a voltage level on output signal OUTB 712, output OUT 711 may begin to be pulled to a logically high voltage level, such as may be determined at least in part by supply voltage 721, via transistor 705 or pulled to a logically low voltage level via transistor 715 at least in part in response to assertion of SE 703. Similarly, depending at least in part on a voltage level on output signal OUT 711, output OUTB 712 may begin to be pulled to a logically high voltage level via transistor 710 or pulled to a logically low voltage level via transistor 720 at least in part in response to assertion of SE 703.

In an embodiment, due at least in part to bit-line signal BL 701 and inverse bit line signal BLB 702, respectively, being inverses of each other, one of OUT 711 and OUTB 712 may tend to be pulled to a logically high voltage level, and the other of OUT 711 and OUTB 712 may tend to be pulled to a logically low voltage level. Similar to what was discussed above, rates at which the signals are pulled towards either a logically high voltage level or a logically low voltage level may depend, at least in part, on the physical characteristics of transistors and/or other structures, such as transistors 705, 715, and/or 735, as well as transistors 710, 720, and/or 730. In an embodiment, it may be advantageous to adjust the rates at which one or both of output signals 711 and 712 are pulled towards either a logically low voltage level or a logically high voltage level to compensate, at least in part, for differences in physical characteristics of one or more transistors and/or other circuit structures.

In an embodiment, programmable impedance circuits 750 and/or 755 may act as registers to store one or more signals and/or states that are indicative of a specified amount of current flow to be added in parallel with transistors 735 and/or 740 via transistors 725 and/or 730, respectively. For example, various programmable values for programmable impedance circuit 750 may result in different voltage levels being applied to the gate of transistor 725 which may, at least in part, determine an amount of current flow to be added in parallel to transistor 735. Also, for example, different programmable values for programmable impedance circuit 755 may result in various voltage levels being applied to the gate of transistor 730 which may, at least in part, determine an amount of current flow to be added in parallel to transistor 740. In an embodiment, a change in current flow due at least in part to transistor 725 and programmable impedance circuit 750 may effect a change in a rate at which OUTB 712 is either pulled to a logically high voltage level or pulled to a logically low voltage level. Similarly, a change in current flow due at least in part to transistor 730 and programmable impedance circuit 755 may effect a change in a rate at which OUT 711 is either pulled to a logically high voltage level or pulled to a logically low voltage level. As mentioned above, advantageous values for programmable impedance circuits 750 and/or 755 may be determined at least in part through experimentation as part of a manufacturing process, in an embodiment.

Figure 8:
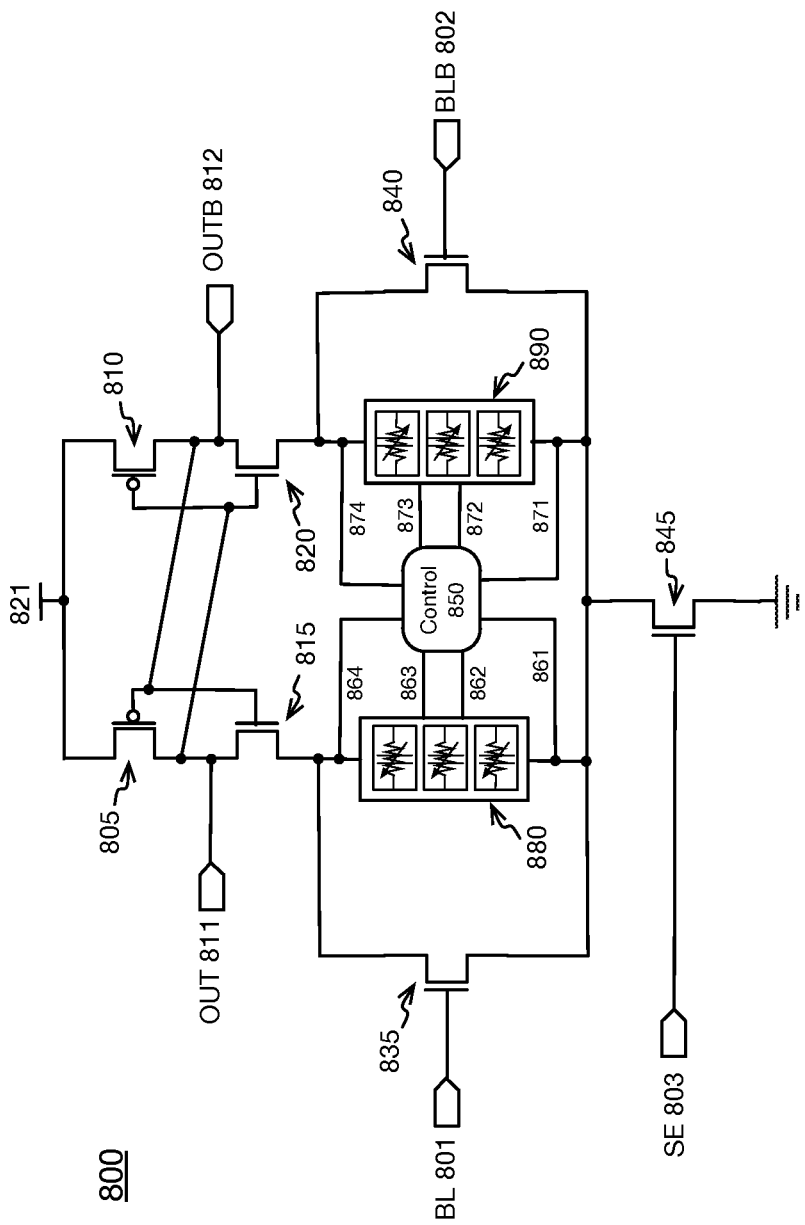
FIG. 8 is a schematic diagram depicting an example sense amplifier including a plurality of correlated electron switch devices, in accordance with an embodiment.

FIG. 8 is a schematic diagram depicting an embodiment 800 of an example sense amplifier circuit including a plurality of CES devices, such as variable impedance circuits 880 and/or 890. In an embodiment, an assertion of a sense enable signal (SE), such as SE 803, may enable a transistor, such as NMOS transistor 845, and current may begin to flow through one or more of NMOS transistors 835 and/or 840, as well as through NMOS transistors 815 and/or 820 and/or one or more of PMOS transistors 805 and/or 810. Depending at least in part on a voltage level on output signal OUTB 812, output signal OUT 811 may begin to be pulled to a logically high voltage level, such as may be determined at least in part by supply voltage 821, via transistor 805 or pulled to a logically low voltage level via transistor 815 at least in part in response to assertion of SE 803. Similarly, depending at least in part on a voltage level on output signal OUT 811, output OUTB 812 may begin to be pulled to a logically high voltage level via transistor 810 or pulled to a logically low voltage level via transistor 820 at least in part in response to assertion of SE 803.

In an embodiment, due at least in part to BL 801 and BLB 802 being approximate inverses of each other, one of OUT 811 and OUTB 812 may tend to be pulled to a logically high voltage level, and the other of OUT 811 and OUTB 812 may tend to be pulled to a logically low voltage level. Similar to what was discussed previously, rates at which the signals are pulled towards either a logically high voltage level or a logically low voltage level may depend, at least in part, on the physical characteristics of transistors and/or other structures, such as transistors 805, 810, 815, 820, 830, and/or 835. In an embodiment, programmable impedance circuits 880 and/or 890 may be adjusted to change impedance characteristics and to therefore adjust an amount of current flow in parallel with transistors 835 and/or 840, respectively. For example, different programmable values for programmable impedance circuit 880 may result in different levels of current flow through programmable impedance device 880 and may also therefore result in a variable amount of current flow to be added in parallel with transistor 840. Further, for example, different programmable values for programmable impedance circuit 890 may result in different levels of current flow through programmable impedance device 890 and may therefore result in a variable amount of current flow to be added in parallel with transistor 840.

In an embodiment, a change in current flow due at least in part to transistor 835 and programmable impedance circuit 880 may effect a change in a rate at which OUTB 812 is either pulled to a logically high voltage level or pulled to a logically low voltage level. Similarly, a change in current flow due at least in part to transistor 840 and programmable impedance circuit 890 may effect a change in a rate at which OUT 811 is either pulled to a logically high voltage level or pulled to a logically low voltage level. Values for programmable impedance circuits 880 and/or 890 may be determined at least in part through experimentation as part of a manufacturing process, in an embodiment.

Additionally, in an embodiment, a sense amplifier circuit, such as 800, may include a control circuit, such as control circuit 850, to provide one or more voltage signals, such as voltage signals 861, 862, 863, and/or 864, as well as voltage signals 871, 872, 873, and/or 874, for example. In an embodiment, the four independent voltage signals 861-864 coupled between control circuit 850 and variable impedance circuit 880 may comprise similar voltage signals to those depicted in FIG. 4 and discussed above. Similarly, the four independent voltage signals 871-874 coupled between control circuit 850 and variable impedance circuit 890 may also comprise similar voltage signals to those depicted in FIG. 4 and discussed above. Thus, in an embodiment, individual CES devices of variable impedance circuits 880 and/or 890 may be individually programmed, and a range of different impedances may be specified for variable impedance circuits 880 and/or 890 to help reduce voltage offset and/or to help compensate for variations in manufacturing process, for example.

Although the examples described herein, including embodiment 800 depicted in FIG. 8, are shown and discussed with particular configurations of CES devices and/or programmable impedance circuits and/or voltage signals, and so forth, claimed subject matter is not limited in scope to the specific examples provided herein. For example, although specific types of transistors are described, claimed subject matter is not so limited.

Figure 9:
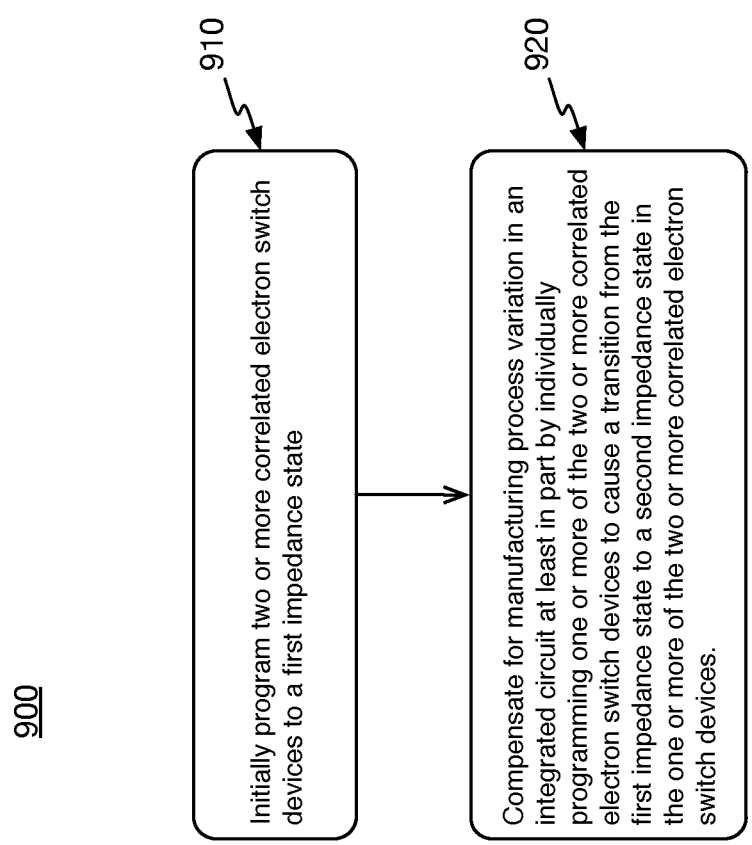
FIG. 9 depicts a simplified flowchart for an example process for compensating for integrated circuit manufacturing process variation, in accordance with an embodiment.

FIG. 9 depicts a simplified flowchart for an embodiment 900 of an example process for compensating for integrated circuit manufacturing process variation. Embodiments in accordance with claimed subject matter may include all of blocks 910-920, fewer than blocks 910-920, or more than blocks 910-920. Also, the order of blocks 910-920 is merely an example order, and claimed subject matter is not limited in scope in this respect.

At block 910, two or more CES devices may be initially programmed to a first impedance state. At block 920, variations in manufacturing process may be compensated for at least in part by individually programming one or more of the two or more CES devices to cause a transition from the first impedance state to a second impedance state in the one or more of the two or more CES devices.

Further, in an embodiment, individually programming the at least one of the two or more CES devices may include applying one or more voltage signals to the at least one of the two or more CES devices sufficient to transition the at least one of the two or more CES devices from a first impedance state to a second impedance state. In an embodiment, the first impedance state may comprise a relatively lower impedance state and the second impedance state may comprise a relatively higher impedance state.

Also, in an embodiment, the two or more CES devices may comprise three or more CES devices. Individually programming the at least one of the three or more CES devices may include applying two or more voltage signals to at least two of the three or more CES devices sufficient to transition the at least two of the three or more CES devices from the relatively lower impedance state to the relatively higher impedance state.

Additionally, in an embodiment, the integrated circuit may comprise a sense amplifier circuit, wherein compensating for the manufacturing process variation in the sense amplifier circuit may include adjusting a capacitance at a particular node of the sense amplifier circuit at least in part by individually programming the at least one of the two or more CES devices. Similarly, in an embodiment, compensating for manufacturing process variation in the sense amplifier circuit may comprise adjusting current flow at a particular node of the sense amplifier circuit at least in part by individually programming the at least one of the two or more CES devices. Additionally, adjusting the current flow at the particular node may include at least partially enabling one or more transistors configured in parallel with another one or more transistors to adjust the current flow at the particular node of the sense amplifier circuit, in an embodiment.

Figure 10:
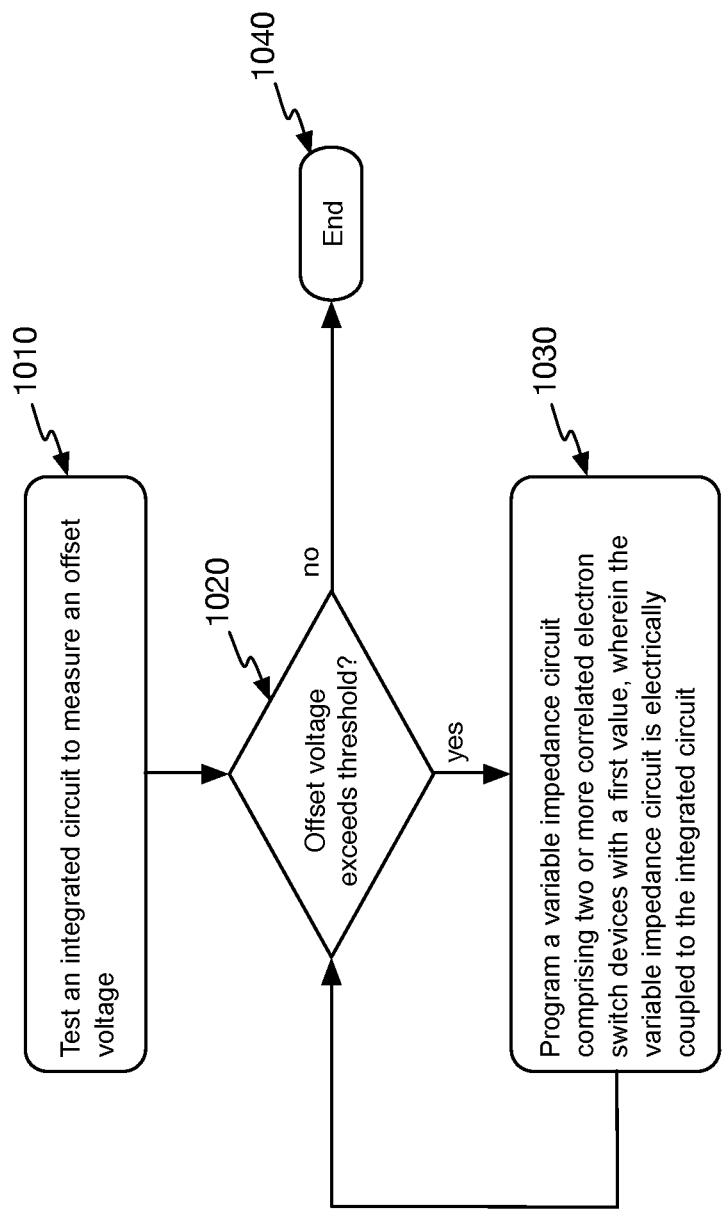
FIG. 10 depicts a simplified flowchart for an example process for compensating for integrated circuit manufacturing process variation, in accordance with an embodiment.

FIG. 10 depicts a simplified flowchart for an embodiment 1000 of an example process for compensating for integrated circuit manufacturing process variation. Embodiments in accordance with claimed subject matter may include all of blocks 1010-1040, fewer than blocks 1010-1040, or more than blocks 1010-1040. Also, the order of blocks 1010-1040 is merely an example order, and claimed subject matter is not limited in scope in this respect.

At block 1010, an integrated circuit may be tested to measure an offset voltage. For example, a plurality of integrated circuits may be fabricated on a silicon wafer, in an embodiment. Testing procedures may be performed on at least some of the integrated circuits to determine viability, reliability, etc. Further, one or more circuit performance parameters may be tested. For the example of embodiment 1000, testing procedures may determine whether an offset voltage for an integrated circuit may exceed a specified voltage level. In an embodiment, an integrated circuit may comprise one or more sense amplifiers, and an offset voltage related to the one or more sense amplifiers may be tested, for example.

As depicted at blocks 1020 and 1030, at least in part in response to an offset voltage exceeding a threshold voltage level, a variable impedance circuit comprising two or more correlated electron switch devices may be programmed with a first value. In an embodiment, the variable impedance circuit may be electronically coupled to the integrated circuit. For example, the variable impedance circuit may be electronically coupled to a sense amplifier, and depending on how the variable impedance circuit is programmed, an offset voltage associated with the sense amplifier may be effected.

In an embodiment, at least in part in response to the variable impedance circuit having been programmed with the first value, a determination may be made as to whether the offset voltage exceeds the specified threshold voltage, as depicted at block 1020. Also, in an embodiment, if a determination is made that the offset voltage continues to exceed the threshold, additional programming may occur, as depicted at block 1030. If a determination is made that the offset voltage does not exceed the threshold voltage, processing may end, as depicted at block 1040. Of course, embodiments in accordance with claimed subject matter are not limited in scope to the specific examples described herein, as discussed above.

In the context of the present disclosure, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other electrical conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" may be understood to mean indirectly connected in an appropriate context. It is further noted, in the context of the present disclosure, the term physical if used in relation to memory, such as memory components or memory states, as examples, necessarily implies that memory, such memory components and/or memory states, continuing with the example, is tangible.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

Algorithmic descriptions and/or symbolic representations are examples of techniques used by those of ordinary skill in the signal processing and/or related arts to convey the substance of their work to others skilled in the art. An algorithm is, in the context of the present disclosure, and generally, is considered to be a self-consistent sequence of operations and/or similar signal processing leading to a desired result. In the context of the present disclosure, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular disclosure, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method, comprising:
compensating for manufacturing process variation in an integrated circuit at least in part by programming a variable impedance circuit comprising two or more series-configured and individually programmable correlated electron switch devices including one or more correlated electron materials having bulk-switching characteristics, wherein the programming the variable impedance circuit includes applying one or more programming signals having a current of a magnitude sufficient to provide a concentration of electron holes within at least one of the one or more correlated electron materials sufficient to place at least one of the two or more series-configured and individually programmable correlated electron switch devices in a relatively higher impedance state.

2. The method of claim 1, wherein the programming the variable impedance circuit comprises individually programming at least two of the two or more series-configured and individually programmable correlated electron switch devices concurrently, and wherein the applying the one or more programming signals comprises applying two or more programming signals concurrently.

3. The method of claim 2, wherein the individually programming the at least two of the two or more series-configured and individually programmable correlated electron switch devices comprises applying the two or more programming signals having current densities sufficient to transition the at least two of the two or more series-configured and individually programmable correlated electron switch devices from a first impedance state to a second impedance state.

4. The method of claim 3, wherein the first impedance state comprises a relatively lower impedance state and wherein the second impedance state comprises the relatively higher impedance state.

5. The method of claim 4, wherein the two or more series-configured and individually programmable correlated electron switch devices comprise three or more series-configured and individually programmable correlated electron switch devices, and wherein the individually programming the at least two of the three or more series-configured and individually programmable correlated electron switch devices comprises applying one or more voltage signals sufficient to transition at least one of the three or more series-configured and individually programmable correlated electron switch devices from the relatively higher impedance state to the relatively lower impedance state.

6. The method of claim 1, wherein the integrated circuit comprises a sense amplifier circuit.

7. The method of claim 6, wherein the compensating for the manufacturing process variation in the sense amplifier comprises adjusting a capacitance at a particular node of the sense amplifier circuit at least in part by the individually programming at least one of the two or more series-configured and individually programmable correlated electron switch devices.

8. The method of claim 6, wherein the compensating for the manufacturing process variation in the sense amplifier comprises adjusting current flow at a particular node of the sense amplifier circuit at least in part by the individually programming at least one of the two or more series-configured and individually programmable correlated electron switch devices.

9. The method of claim 8, wherein the adjusting the current flow at the particular node comprises at least partially enabling one or more transistors configured in parallel with another one or more transistors to adjust the current flow at the particular node of the sense amplifier circuit.

10. The method of claim 1, wherein the one or more programming signals have currents of a magnitude sufficient to provide a concentration of electron holes within the one or more correlated electron materials substantially equal to a concentration of electrons within the one or more correlated electron materials.

11. An apparatus, comprising:
a programmable variable impedance circuit comprising two or more series-configured and individually programmable correlated electron switch devices, wherein the two or more correlated electron switch devices include one or more correlated electron materials having bulk-switching characteristics; and a control circuit to apply one or more programming signals to at least one of the two or more series-configured and individually programmable correlated electron switch devices to compensate at least in part for manufacturing process variation in an integrated circuit, wherein the one or more programming signals have a current of a magnitude sufficient to provide a concentration of electron holes within the one or more correlated electron materials sufficient to place the at least one of the two or more series-configured and individually programmable correlated electron switch devices in a relatively higher impedance state.

12. The apparatus of claim 11, wherein the two or more series-configured and individually programmable correlated electron switch devices comprise a first correlated electron switch device and a second correlated electron switch device electrically coupled to each other via a first node, wherein the first correlated electron switch device has a second node and wherein the second correlated electron switch device has a third node.

13. The apparatus of claim 12, further comprising a first voltage signal line coupled between the control circuit and the second node and a second voltage signal line electrically coupled between the control circuit and the first node, the control circuit to individually program the first correlated electron switch device via application of a first programming voltage across the first and second voltage signal lines.

14. The apparatus of claim 13, further comprising a third voltage signal line electrically coupled between the control circuit and the third node, the control circuit to individually program the second correlated electron switch device via application of a second programming voltage across the second and third voltage signal lines.

15. The apparatus of claim 14, wherein the two or more series-configured and individually programmable correlated electron switch devices comprise a third correlated electron switch device electrically coupled to the second correlated electron switch device via the third node, wherein the third correlated electron switch device has a fourth node.

16. The apparatus of claim 15, further comprising a fourth voltage signal line electrically coupled between the control circuit and the fourth node, the control circuit to individually program the third correlated electron switch device via application of a third programming voltage across the third and fourth voltage nodes.

17. The apparatus of claim 16, wherein at least two of the first, second, and third programming voltages comprise voltage levels sufficient to induce a transition in impedance state for respective at least two of the first, second, and third correlated electron switch devices from a first impedance state to a second impedance state.

18. The apparatus of claim 17, wherein the first impedance state comprises a relatively lower impedance state and the second impedance state comprises the relatively higher impedance state.

19. The apparatus of claim 17, wherein the at least two of the first, second, and third programming voltages induce the transition in the impedance state for the respective at least two of the first, second, and third correlated electron switch devices to compensate at least in part for the manufacturing process variation in the integrated circuit.

20. The apparatus of claim 11, wherein the one or more programming signals have currents of a magnitude sufficient to provide a concentration of electron holes within the one or more correlated electron materials substantially equal to a concentration of electrons within the one or more correlated electron materials.

* * * * *